(12) United States Patent
Mohseni et al.

(10) Patent No.: US 9,054,247 B2
(45) Date of Patent: Jun. 9, 2015

(54) SINGLE-PHOTON NANO-INJECTION DETECTORS

(71) Applicant: Northwestern University, Evanston, IL (US)

(72) Inventors: Hooman Mohseni, Wilmette, IL (US); Omer G. Memis, Evanston, IL (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 13/925,490

(22) Filed: Jun. 24, 2013

(65) Prior Publication Data
US 2013/0341594 A1 Dec. 26, 2013

Related U.S. Application Data

(60) Provisional application No. 61/664,121, filed on Jun. 25, 2012, provisional application No. 61/776,558, filed on Mar. 11, 2013.

(51) Int. Cl.
*H01L 31/0352* (2006.01)
*H01L 31/109* (2006.01)
*B82Y 20/00* (2011.01)

(52) U.S. Cl.
CPC ...... *H01L 31/035236* (2013.01); *H01L 31/109* (2013.01); *B82Y 20/00* (2013.01)

(58) Field of Classification Search
CPC ..... H01L 31/0352; H01L 29/12; H01L 29/06; H01L 31/00; H01L 29/08
USPC ...................................................... 257/20–22
See application file for complete search history.

(56) References Cited

U.S. PATENT DOCUMENTS

| 7,282,777 B1* | 10/2007 | Chuang et al. ................ 257/431 |
| 7,745,816 B2 | 6/2010 | Mohseni |
| 2010/0032652 A1* | 2/2010 | Okamura et al. ............... 257/21 |

OTHER PUBLICATIONS

Sidhu et al., "A long-wavelength photodiode on InP using lattice-matched GaInAs—GaAsSb type-II quantum wells", IEEE Photonics Technology Letters, vol. 17, No. 12, pp. 2715-2717, Dec. 2005.*
Sidhu et al., "A long-wavelength photodiode on InP using lattice-matched GaInAs—GaAsSb type-II quantum wells", IEEE Photonics Technology Letters, vol. 17, No. 12, p. 2715, col. 2 at 1, Dec. 2005.*
Mohseni, et al. "High Peformance type-II InAs/GaSb superlattice photodiodes", Proceedings of SPIE vol. 4288, pp. 191-199, 2001.*
Memis et al., A photon detector with very high gain at low bias and at room temperature, Applied Physics Letters, vol. 91, No. 171112, Oct. 25, 2007, pp. 1-3.
O.G. Memis, W. Wu, D. Dey, A. Katsnelson and H. Mohseni, "Detailed Numerical Modeling of a Novel Infrared Single Photon Detector for λ> 1 μm", 7th International Conference on Numerical Simulation of Optoelectronic Devices, 63-64, (2007).

(Continued)

*Primary Examiner* — Matthew Reames
*Assistant Examiner* — Vincent Wall
(74) *Attorney, Agent, or Firm* — Bell & Manning LLC

(57) ABSTRACT

Single-photon detectors, arrays of single-photon detectors, methods of using the single-photon detectors and methods of fabricating the single-photon detectors are provided. The single-photon detectors combine the efficiency of a large absorbing volume with the sensitivity of nanometer-scale carrier injectors, called "nanoinjectors". The photon detectors are able to achieve single-photon counting with extremely high quantum efficiency, low dark count rates, and high bandwidths.

20 Claims, 12 Drawing Sheets

(56) References Cited

OTHER PUBLICATIONS

O. G. Memis, A. Katsnelson and H. Mohseni, "Low Noise, High Gain Short-Wave Infrared Nano-Injection Photon Detectors with Low Jitter", IEEE Lasers and Electro-Optics Society, 21st Annual Meeting of the, 159, (2008).

Mohseni et al., A Novel Nano-Injector Based Single Photon Infrared Detector, Enabling Photonics Technologies for Defense, Security, and Aerospace Apps. II, edited by Hayduk et al., Proc. of SPIE vol. 6243, (2006).

* cited by examiner

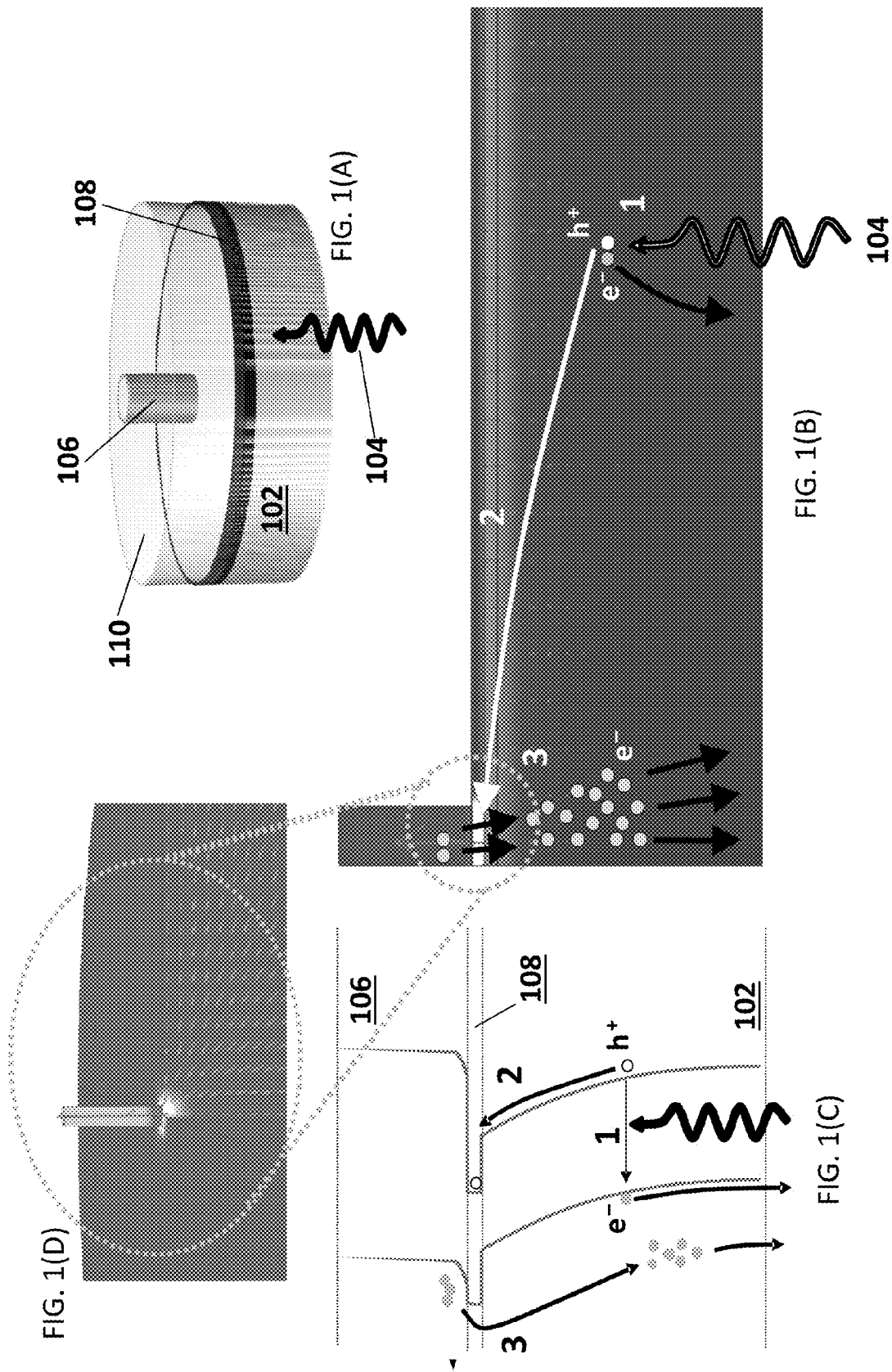

Structure A

| Layer # | Material | Thickness | Doping |
|---|---|---|---|
| 6 | $In_{0.53}Ga_{0.47}As$ | 50 nm | $N \sim 10^{19}$ |
| 5 | InP | 500 nm | $N \sim 10^{17}$ |
| 4 | $In_{0.52}Al_{0.48}As$ | 50 nm | Undoped |
| 3 | $GaAs_{0.52}Sb_{0.48}$ | 50 nm | $P \sim 5 \times 10^{18}$ |
| 2 | $In_{0.53}Ga_{0.47}As$ | 3000 nm | $N < 1 \times 10^{15}$ |
| 1 | $In_{0.53}Ga_{0.47}As$ | 50 nm | $N = 1 \times 10^{18}$ |

FIG. 2(A)

Structure B

| Layer # | Material | Thickness | Doping |
|---|---|---|---|
| 6 | $In_{0.53}Ga_{0.47}As$ | 50 nm | $N \sim 10^{19}$ |
| 5 | InP | 100 nm | $N \sim 10^{17}$ |
| 5 | InP | 50 | $N < 1 \times 10^{15}$ |
| 4 | $In_{0.52}Al_{0.48}As$ | 10 nm | Undoped |
| 3 | $GaAs_{0.52}Sb_{0.48}$ | 50 nm | $P \sim 1 \times 10^{17}$ |
| 2 | $In_{0.53}Ga_{0.47}As$ | 3000 nm | $N < 1 \times 10^{15}$ |
| 1 | $In_{0.53}Ga_{0.47}As$ | 50 nm | $N = 1 \times 10^{18}$ |

FIG. 2(B)

SINGLE-PHOTON NANO-INJECTION DETECTORS

CROSS-REFERENCE TO RELATED APPLICATIONS

This application claims priority to U.S. provisional patent application Ser. No. 61/664,121, filed on Jun. 25, 2012, and to U.S. provisional patent application Ser. No. 61/776,558, filed on Mar. 11, 2013, the entire disclosures of which are incorporated herein by reference.

BACKGROUND

A single-photon detector provides the ultimate limit of extremely weak electromagnetic radiation detection in term of sensitivity. Compact solid-state single-photon detectors are regarded as enabling components in a wide range of applications such as biophotonics, tomography, homeland security, non-destructive material inspection, astronomy, quantum key distribution, and quantum imaging. Despite the astonishing progress of these fields in recent years, there has been little progress in the performance of single-photon detectors, and thus the single-photon detector is quickly becoming the "bottleneck" in these fields. Some of the important shortcomings of the current single-photon detectors are: poor quantum efficiency, high dark count rates, lack of imaging arrays, severe cooling requirement for longer wavelengths, and large dead-times (low bandwidth) due to afterpulsing. Unfortunately, these problems become much more significant for wavelengths beyond the visible range where a large number of applications can benefit the most. In particular, these drawbacks have prevented demonstration of the much-needed high-performance single-photon detectors beyond the visible wavelength, and high-performance arrays of single-photon detectors.

SUMMARY

Single-photon detectors for use in the infrared, including the near-infrared, having high quantum efficiencies, high speeds and low dark currents are provided.

One embodiment of a photon detector comprises a semiconductor heterostructure, the semiconductor heterostructure comprising: (a) a photon absorber comprising a layer of photon absorbing material capable of absorbing photons and generating electron-hole pairs; and (a) a carrier injector adapted to inject carriers into the photon absorber. The carrier injector comprises: (i) a layer of carrier injecting material capable of generating carriers (i.e., either electrons or holes) of a first type upon the application of a bias voltage; and (ii) a carrier trap disposed between the layer of carrier injecting material and the layer of photon absorbing material. The carrier trap comprises a layer of potential barrier-forming material which forms a potential trap for carriers of a second type (i.e., either holes or electrons). In this structure, the photon absorbing material, the carrier injecting material and the potential barrier-forming material have a band structure with a type II band alignment. The detectors may be characterized by the ability to detect a single-photon in the infrared with a quantum efficiency of at least 50% (e.g., at least 80%, at least 90%, or at least 95%) at a wavelength of about 1550 nm, a bandwidth of at least 1 GHz, or a dark count rate of no greater than 1 kHz at a temperature in the range from about 150K to 298K and a bias voltage of about 1 V.

The photon detectors may include a layer of passivating material disposed around the external surface of the layer of carrier injecting material and a layer of passivating material disposed between the layer of carrier injecting material and the layer of potential barrier-forming material.

In some embodiments of the photon detectors, the layer of carrier injecting material comprises a first region having a first dopant concentration and a second region disposed between the first region and the carrier trap, wherein the second region has a dopant concentration that is lower than the first dopant concentration. For example, in some embodiments of the photon detectors the second region is undoped.

By way of illustration, the photon absorbing material can be InGaAs, the carrier injecting material can be n-type doped InP, the potential barrier-forming material can p-type doped GaAsSb and the layer of passivating material disposed between the layer of carrier injecting material and the layer of potential barrier-forming material can be InAlAs. In these embodiments, the layer of GaAsSb desirably has a thickness of no greater than about 60 nm and the layer of InAlAs desirably has a thickness of no greater than about 15 nm.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 1. Clockwise from top right: (A) the schematic view of a photon detector having a nanoinjector. (B) The cross-section of the detector and detection mechanism. (C) The band structure of the device heterostructure along the central axis. (D) a view of the nanoinjector region.

FIG. 2 (A) The layer structure of a Type-A single-photon detector.

FIG. 2 (B) The layer structure of a Type-B single-photon detector.

DETAILED DESCRIPTION

Figure 3:
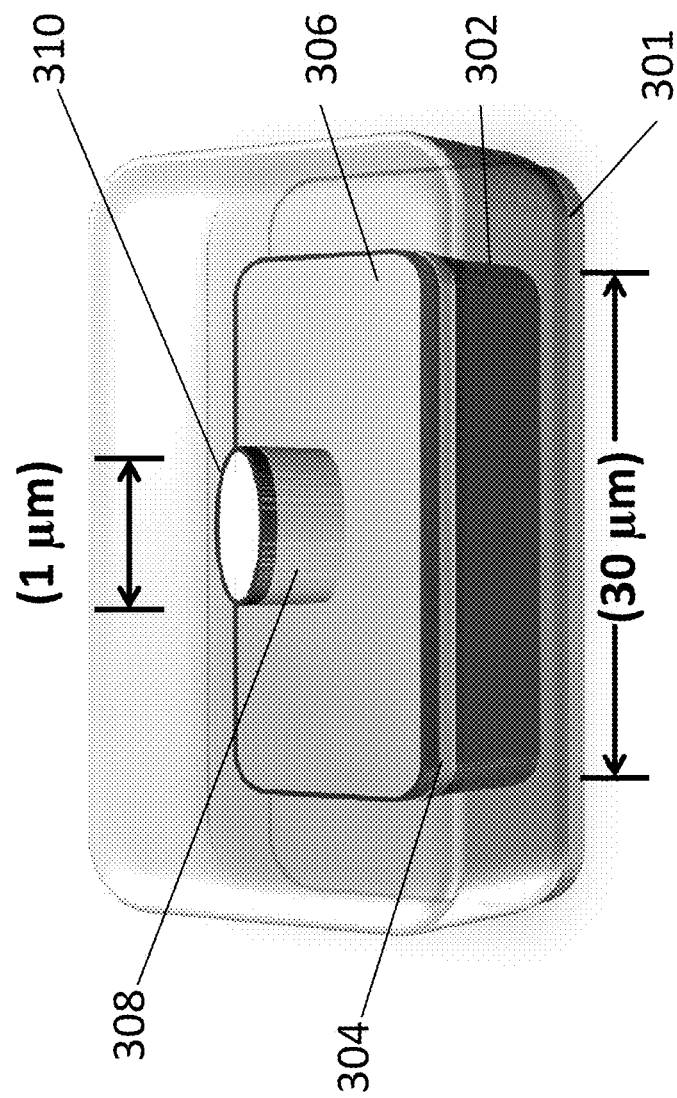
FIG. 3. Schematic diagram of showing the geometry of a single-photon detector.

Single-photon detectors, arrays of single-photon detectors, methods of using the single-photon detectors and methods of fabricating the single-photon detectors are provided.

The single-photon detectors combine the efficiency of a large absorbing volume with the sensitivity of nanometer-scale carrier injectors, called "nanoinjectors". In combination with readout integrated circuits (ROIC), the detectors are able to achieve single-photon counting with extremely high quantum efficiency, low dark count rates, and high bandwidths. For example, some embodiments of the photon detectors are able to provide single-photon detection with a quantum efficiency of 90%, or better, with a bandwidth of at least 1 GHz and a dark count rate of no greater than 1 kHz at a temperature of 150K or higher. These exceptional performance characteristics can be achieved in combination with exceptional gains, including gains of 10,000 or better at a bias voltage of 1 V at 1.55 μm.

The single-photon detectors and arrays of the single-photon detectors are useful in a variety of diverse applications. These include, but are not limited quantum imaging, night vision, high-bandwidth secure communication, medical IR imaging, and non-destructive mechanical/structural evaluation.

Single-Photon Detector Structure:

The photon detectors comprise a semiconductor heterostructure that defines a photon absorber having a large absorbing volume and a carrier injector that is configured to inject carriers (i.e., electrons or holes) into the photon absorber. FIG. 1(A) is a schematic diagram showing a perspective view of an embodiment of a single-photon detector. The photon absorber comprises a layer of photon absorbing material 102 that is capable of absorbing a photon 104 and generating an electron-hole pair. The carrier injector comprises a layer of carrier injecting material 106 that is capable of generating carriers of a first type (either electrons or holes) upon the application of a bias voltage, and further includes a carrier trap comprising a layer of potential barrier-forming material 108. The structure may further include a layer of planarizing material 110 disposed over its upper surface. The energy band structure for the heterostructure, shown in FIG. 1(C), has a type II band alignment in which potential barrier-forming material 108 forms a conduction band barrier for the injected carriers (in this case electrons) and a valence band trap for carriers opposite in type from those generated by the carrier injector (in this case, a valence band trap for holes). Using a nanoscale injector (i.e., an injector having a thickness and a diameter no greater than about 1 μm) is advantageous because it can provide a low dark count and a substantial increase in carrier injection, as described below. However, injectors having dimensions above the nanoscale can also be employed for applications were high gains and ultralow dark currents are not critical.

The basic detection and gain mechanism in the detector is shown in FIG. 1(B). An incoming photon 104 is absorbed in the thick photon absorbing layer and produces an electron-hole pair (shown as '1'). The internal electric field of the detector attracts the carriers (in this case holes) towards the carrier injector (in this case, an electron injector), which is located centrally above the layer of photon absorbing material 102. When the optically created hole reaches the carrier injector, it becomes trapped in the small region formed by the carrier trap (shown as '2'). Due to its small volume, the carrier trap has an ultra-small capacitance and, therefore, even the very small charge of the trapped hole results in a large reduction in the conduction potential barrier which, in turn, leads to a substantial increase in the electron injection from the injector into the photon absorber (shown as '3'). In some embodiments of the photon detectors, the total injected charge can be many orders of magnitude larger than the photogenerated charge. Interestingly, the electron injection through the thin barrier can reduce the probability for electron "bunching" and provide a more ordered arrival of electrons. This is similar to the "Fano" effect, and leads to a noise level below the shot-noise limit.

In addition to layer of photon absorbing material, the layer of carrier injecting material and the potential barrier-forming layer, the photon detectors may include surface passivating layers in order to enhance the speed of the devices. The passivation layers prevent surface states or other external fields from penetrating into the heterostructure and enhancing dark current, or otherwise disrupting the operation of the detectors. Layers of passivating material can be coated over and/or around the exposed exterior surfaces of the carrier injector and the photon absorber and/or disposed within the heterostructure between the layer of carrier injecting material and the layer of potential barrier-forming material. However, when a passivation layer is included within the heterostructure, it should be sufficiently thin that its presence does not alter energy band structure in such a way that device performance is significantly negatively affected. In particular, the passivation layer may be sufficiently thin that it does not provide an additional barrier in the conduction band and it minimizes or eliminates shielding between the layer of carrier injecting material and the layer of potential barrier-forming material that would reduce the signal amplification in the detector. While the optimal thickness of such a passivation layer will depend upon the material from which it is made, in some embodiments of the photon detectors this passivation layer is no greater than about 20 nm thick. This includes embodiments in which the passivation layer is no greater than about 15 nm thick and further includes embodiments in which the passivation layer is no greater than about 10 nm thick.

Other material layers that may be present in the photon detectors include; a substrate layer (or layers) upon which the photon absorber may be grown epitaxially; a planarization layer 110 (e.g., spin-on glass) disposed around the periphery of the carrier injector and adapted to facilitate photon detector array fabrication; and one or more electrically conductive contacts (e.g., metal contacts) in electrical communication with the carrier injecting material.

The materials used for the various layers in the photon detectors can be selected from a broad range of materials, provided that the selected material is capable of carrying out the designated function of the layer. Examples of suitable materials for the semiconductor heterostructure are Group III-V semiconductors, such as InP- and GaAs-based materials, and Group II-VI semiconductors, such as CdTe-based materials. Materials suitable for use as surface passivating materials include oxides, such as silicon dioxide and aluminum oxide.

The thicknesses of the various layers in the semiconductor heterostructure can also be selected from a broad range, provided that the selected thickness renders the layer capable of carrying out its designated function. However, the overall thickness of the devices is desirably quite small. For example, the heterostructure defining the carrier injector and the photon absorber typically has a thickness of no greater than about 5 μm. The thickness of the layer of photon absorbing material is desirably large enough to provide a significant absorber volume, but thin enough to limit the effects of carrier recombination. By way of illustration only, typical thicknesses for the layer of photon absorbing material include those in the range from about 1000 to 5000 (e.g., 2000 to 4000) nm. The remaining layers in the semiconductor heterostructure are typically thinner, having thicknesses of, for example, 500 nm or less.

FIG. 2(A) is a table representing one example of a photon detector layer structure, including the material, the thickness and the dopant type and concentration for each layer. A perspective view of the photon detector is provided in FIG. 3. For the purposes of this disclosure, the photon detector depicted in FIG. 2(A) is referred to as "Structure A" or "Type-A". This photon detector includes: $In_{0.53}Ga_{0.47}As$ as a growth substrate 301 (layer 1), $In_{0.53}Ga_{0.47}As$ as the photon absorber 302 (layer 2); $GaAs_{0.52}Sb_{0.43}$ as the potential barrier-forming layer 304 (layer 3); $In_{0.52}Al_{0.48}As$ as layer of passivating material 306 (this layer also serves as an etch stop during device fabrication, as described in greater detail, below) (layer 4); InP as a carrier injecting material 308 (layer 5); and doped $In_{0.53}Ga_{0.47}As$ as an electrically conductive contact 310 (layer 6). The carrier injector in a 'nanoinjector' is which the layer of carrier injecting material has a diameter of about 1 μm. The combination of passivating layers and nanoinjection enable the photon detector to provide single-photon injection with a high gain and a low dark count.

FIG. 2(B) is a table representing another example of a photon detector layer structure, including the material, the thickness and the dopant type and concentration for each layer. The layer structure of this detector is the same as that shown in FIG. 3, although the material compositions and layer thicknesses vary from those shown in FIG. 2(A). For the purposes of this disclosure, the photon detector depicted in FIG. 2(B) is referred to as "Structure B" or "Type B". Like the detector of FIG. 2(A), this photon detector includes: $In_{0.53}Ga_{0.47}As$ as a growth substrate (layer 1), $In_{0.53}Ga_{0.47}As$ as the photon absorber (layer 2); $GaAs_{0.52}Sb_{0.48}$ as the potential barrier-forming layer (layer 3); $In_{0.52}Al_{0.48}As$ as layer of passivating material (layer 4); InP as a carrier injecting material (layer 5); and doped $In_{0.53}Ga_{0.47}As$ as an electrically conductive contact (layer 6). Here, again, the carrier injector in a 'nanoinjector' in which the layer of carrier injecting material has a diameter of about 1 μm. Structure B differs from Structure A in that Structure B has a thinner InAlAs passivating layer, a lower dopant concentration in the GaAsSb potential barrier-forming layer, and a thinner InP carrier injecting layer. In addition, to being thinner, the InP layer comprises two regions an upper n-type doped region and a lower region that is either undoped or has a significantly reduced dopant concentration. As a result of these structural modifications, photon detectors having Structure B are able to provide enhanced performance characteristics relative to the performance characteristics of photon detectors having Structure A for the reasons that follow.

Figures 4A, 4B:
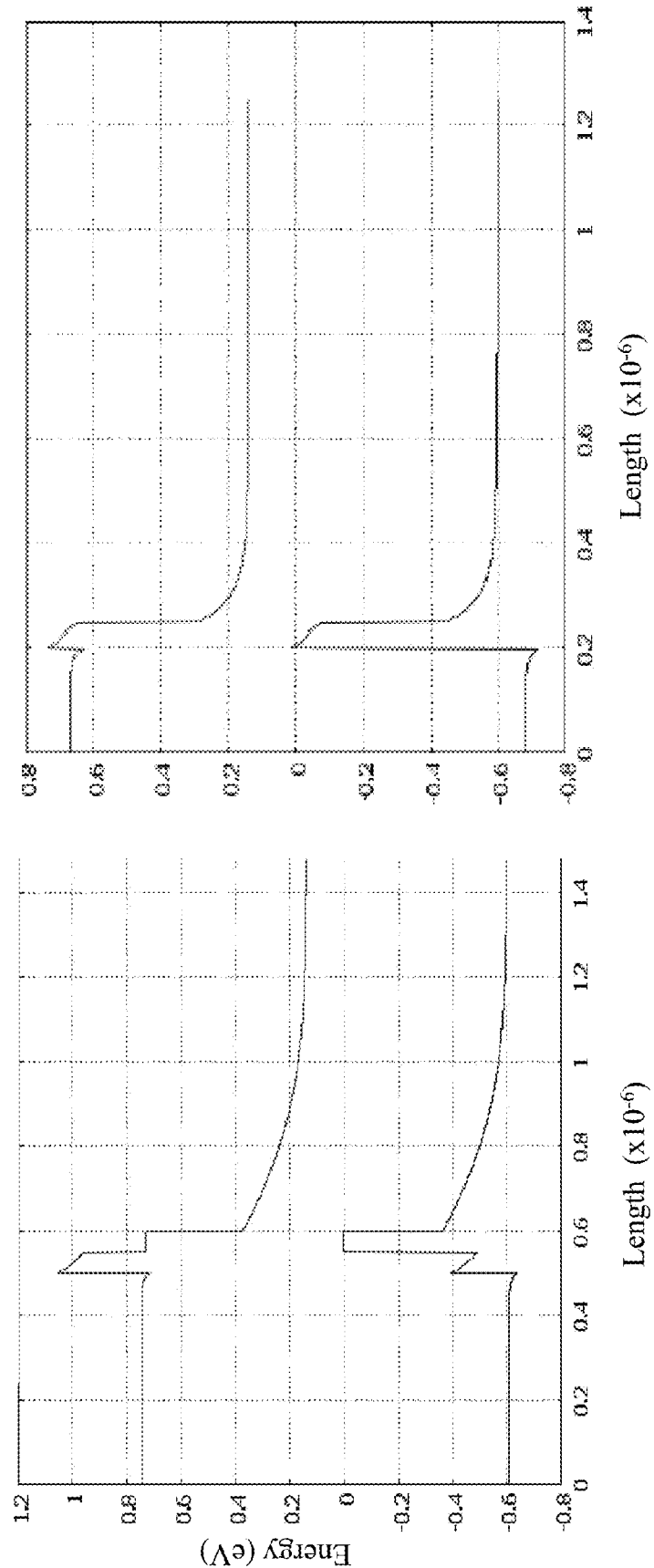
FIG. 4 (A) The central cross section band structure of a Type-A single-photon detector versus (B) a Type-B single-photon detector.

The InAlAs layer serves a dual purpose. It provides an etch stop layer for $CH_4/H_2$ dry etching during the fabrication of the photon detector (see below for a detailed description of the fabrication process). In addition, because updoped InAlAs has a high bandgap it provides an excellent shield to protect the underlying layer (GaAsSb) from surface effects. The passivating effects of this layer are enhanced by the fact that, after etching, it naturally oxidizes to produce a thin $Al_2O_3$ layer. However, the presence of InAlAs can affect the device performance because its low electron affinity can lead to an additional barrier in the conduction band (see FIG. 4(A)). When coupled with its low doping levels, this resistive barrier can lead to shielding between the InP and GaAsSb layers and reduce the amplification of the carrier injection. However, if the InAlAs layer is sufficiently thin (e.g., having a thickness of 15 nm or lower) the effects can be minimized or eliminated, as shown in FIG. 4(B). Model calculations, which are discussed in more detail below, show that the reduction in the InAlAs layer thickness from 50 nm to 10 nm can increase the photon detector gain to over 100,000 while providing an internal dark current that is two orders of magnitude lower.

The lower dopant concentration for the GaAsSb layer in Structure B increases the amplification. Although this amplification comes at the expense of increased leakage current, the leakage current increase can be offset by operating the detector at temperatures below room temperature (i.e., below 298K). Thus, the photon detectors can be operated at temperatures in the range of, for example 100K to room temperature. Lower temperatures can be employed, however, lower temperature are not necessary to achieve high speeds and high quantum efficiencies with low dark counts.

The thickness of the InP layer in Structure B is shortened relative to that of Structure A to improve the mechanical stability of the photon detector during hybridization and to improve the uniformity after planarization. However, the shorter InP means that the GaAsSb layer is closer to the top contact and is, therefore, susceptible to hot electron effects. To prevent such a leakage path, the bottom 50 nm of the InP layer is left undoped.

Figure 5:
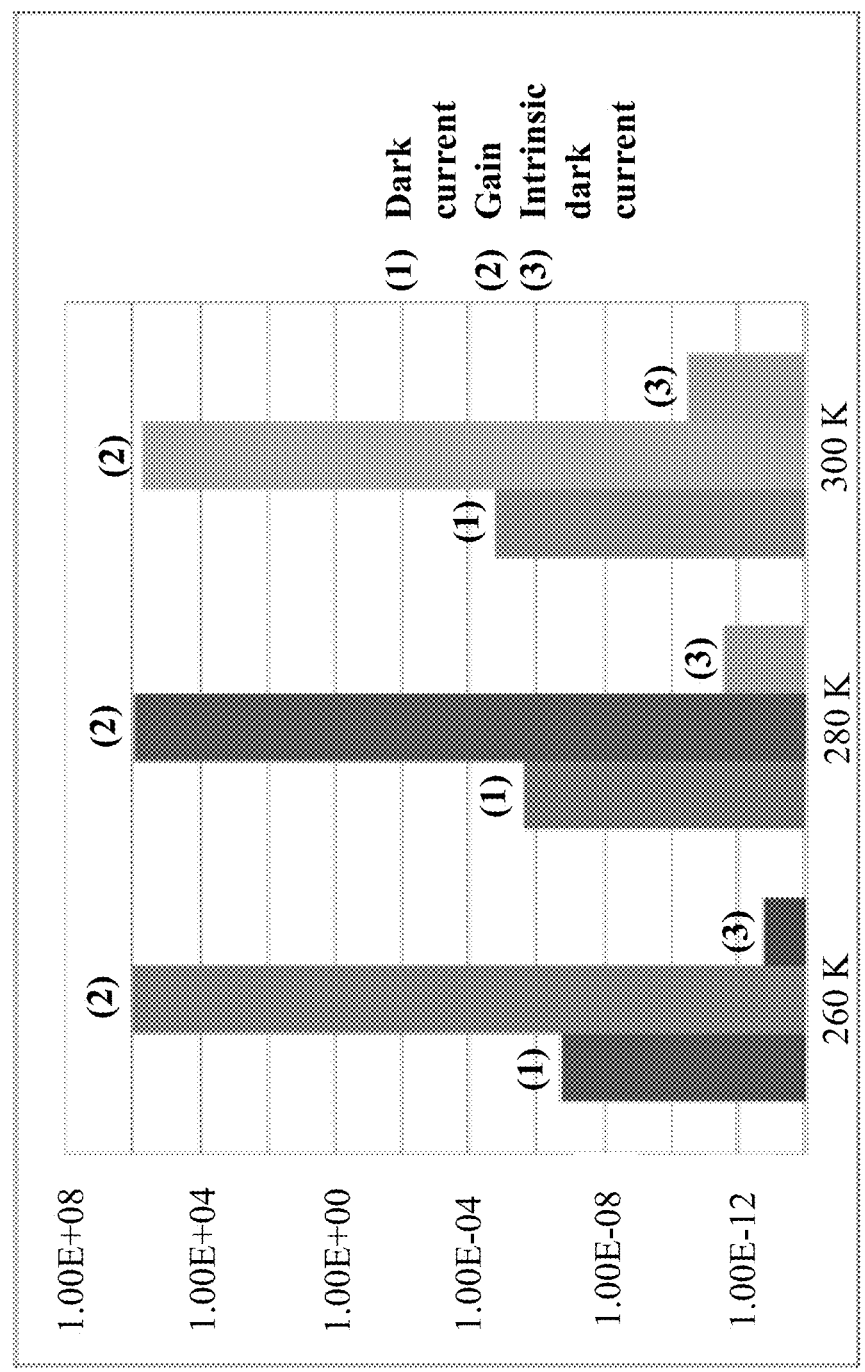
FIG. 5. Simulation results for temperature dependency of the dark current ($1^{st}$ bar in each series, labeled "(1)"), the gain ($2^{nd}$ bar in each series, labeled "(2)") and the intrinsic dark current ($3^{rd}$ bar in each series, labeled "(3)") at 260K (first series), 280K ($2^{nd}$ series) and 300K ($3^{rd}$ series) for a photon detector of Type-B.

As a result of these structural modifications, single-photon detectors having Structure B act as a higher gain version of the detectors having Structure A. Furthermore, the lower electron barrier makes the temperature dependency of the intrinsic dark current stronger—leading to much higher performance at lower temperatures (see FIG. 5). Three dimensional non-linear FEM simulations (discussed below) show that for every 20 K step in cooling, the intrinsic dark current drops more than an order of magnitude. With gain values around 1,000, 000, this makes photon detectors of Structure B very attractive for single-photon detection with high efficiency.

Single-Photon Detector Performance Characteristics:

Improved device performance characteristics realized by the present photon detectors include high quantum efficiencies that ensure any photon incident upon the photon absorber is captured with a high probability and converted into an electron-hole pair. Thus, some embodiments of the present detectors provide single-photon quantum efficiencies of at least 80%. This includes embodiments of the photon detectors having single-photon quantum efficiencies of at least 85%, at least 90% and at least 95%. The device performance characteristics further include photon detectors having dark count rates of no greater than about 3000 Hz. This includes embodiments of the photon detectors having dark count rates of no greater than 1000 Hz, no greater than 500 Hz, no greater than 100 Hz, no greater than 10 Hz and no greater than 1 Hz at a temperature in the range from about 298K to about 100K. These high quantum yields and low dark count rates can be achieved along with high gains and fast response times. For example, some embodiments of the single-photon detectors provide a gain of at least 1000 at a bias voltage of 1 V at 1.55 μm at 298K. This includes detectors having a gain of at least 5000 and at least 10,000 at a bias voltage of 1 V at 1.55 μm at 298K. Finally, some embodiments of the photon detectors have a bandwidth of at least 10 MHz. This includes detectors having a bandwidth of at least 100 MHz and further includes detectors having a bandwidth of at least 1 GHz.

These previously-unrealized device performance characteristics can be calculated using a three-dimensional modeling tool that utilizes a custom finite-element-method (FEM) based simulation model. The model was created in Comsol Multiphysics, which provided a numerical simulation groundwork to implement the stationary, parametric and transient simulation of nonlinear differential equations. The design was based on the self-consistent drift-diffusion equations in two and three dimensions. For devices with cylindrical symmetry, a 2-D cross section simulator was also implemented, which gave accurate 3-D modeling results in the timeframe needed for a simpler 2-D simulation. To improve accuracy under different conditions, several nonlinear effects were implemented. Incomplete ionization of dopants, bimolecular recombination, Auger recombination, nonlinear mobility, impact ionization, thermionic emission, hot electron effects and surface recombination effects were included. Temperature effects, both in the form of variable operating temperature, heat generation and thermal dissipation, were also added to the model.

Figures 6A, 6B:
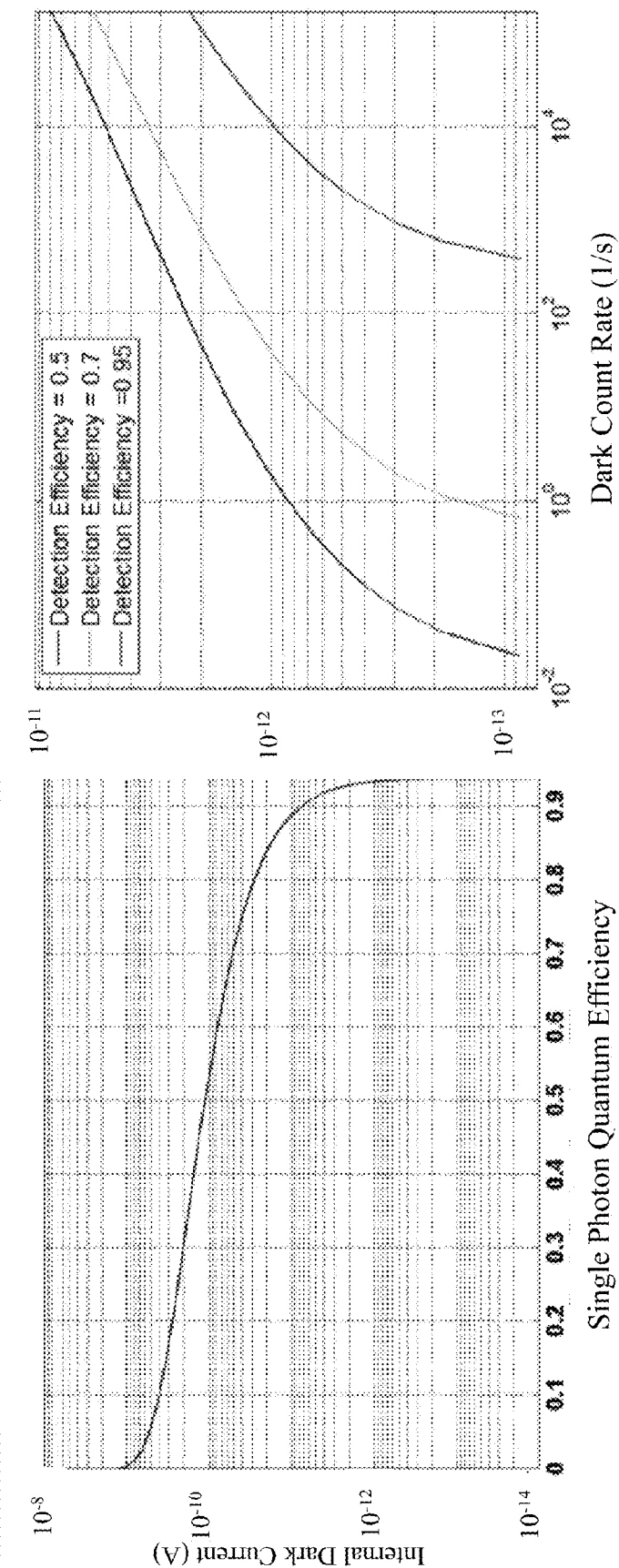
FIG. 6 (A) Single-photon detection efficiency, and (B) dark count rate (right) for a nano-injection detector with gain=1000, quantum efficiency of $\eta=0.9$ and $N_0=1$. The input noise of the ROIC is assumed to be 150 $e^-$ rms.

The above-referenced single-photon quantum efficiencies of the photon detectors can be calculated from: $SPQE=(P_{on}-P_{dark})/P_{ph}$, where $P_{on}$ is the probability that an amplified signal is created either by dark- or photo-current, $P_{dark}$ is the probability that an amplified signal is created solely by dark-current and $P_{ph}$ is the probability that the incident light contains at least 1 photon with an average number photons $N_0$. (See, Y. Kang, H. X. Lu, Y.-H. Lo, D. S. Bethune, and W. P. Risk, "Dark count probability and quantum efficiency of avalanche photodiodes for single-photon detection", *App. Phys. Lett.*, 83, 2955 (2003).) This equation can be expanded by using the amplification probability $P_a$, which is equal to the quantum efficiency; and the number of carriers undergoing amplification in darkness and under illumination, $N_{an}$ and $N_{dark}$. (See, P. A Hiskett, J. M. Smith, G. S. Buller, and P. D. Townsend, "Low-noise Single-photon Detection at a Wavelength of 1.55 μm", *Electron. Lett.* 37 (17), 1081-1083 (2001).) This yields:

$$SPQE = \frac{(1-\exp(-P_a N_{on})) - (1-\exp(-P_a N_{dark}))}{1-\exp(-N_0)} = \frac{\exp\left(-\eta \frac{I_{int}}{q} F\right)[1-\exp(-\eta N_0)]}{1-\exp(-N_0)}$$

where, $I_{int}$ is the dark current before amplification, F is the excess noise factor (F~1), and q is the electron charge. From this equation, the SPQE can be calculated with respect to the external (amplified) dark current, as shown in FIG. 6(A). The signal to noise ratio, SNR, of the detector can be calculated from:

$$SNR^2 = \frac{I_{opt}^2}{I_{noise}^2} = \frac{(q\eta NGBw)^2}{2q\langle I_{int}\rangle G^2 FBw + 2q\langle I_{phot}\rangle G^2 FBw + I_{n,roic}^2 + I_{n,cap}^2} = \frac{(q\eta NGBw)^2}{2q\langle I_{int}\rangle G^2 FBw + 2q\langle q\eta Nf_R\rangle G^2 FBw + \frac{Q_{n,roic}^2|_{T_{int0}} 2BW}{T_{int0}} + k_B T C_{det} Bw^2}$$

which is the ratio of the square of optical pulse current $I_{opt}$ to the noise current $I_{noise}$. Here, $I_{opt}$ is the electron charge q times the quantum efficiency η, the number of photons N, the gain G and the bandwidth Bw. The noise current $I_{noise}$ is the sum of the squares of the shot noise due to the dark current, the shot noise due to the average photocurrent, the read-out noise $I_{n,roic}$ and the capacitive noise $I_{n,cap}$. The shot noise due to dark current is $2q\langle I_{int}\rangle G^2 FBw$ where $\langle I_{int}\rangle$ is the average internal dark current (before amplification) and F is the excess noise factor. The shot noise due to the photo current is $2q\langle I_{phot}\rangle G^2 FBw$ where $\langle I_{phot}\rangle$ is the average photocurrent and is the multiplication of the electron charge q, quantum efficiency η, the number of photons N, and the optical pulse repetition rate $f_R$. The ROIC noise current $I_{n,roic}^2$ is the nominal noise charge $Q_{n,roic}|_{T_{int0}}$ (at an integration time $T_{int0}$) squared, times twice the bandwidth Bw divided by the nominal integration time int0. Finally, the capacitive noise current $I_{n,cap}^2$ is the Boltzmann constant kB times the temperature T, the detector capacitance $C_{det}$ times the bandwidth Bw squared. The relation the signal-to-noise ratio SNR, the detection efficiency $P_{det}$, and the dark count probability ($P_{dark}$) in the detector is similar to receivers with Gaussian statistics due to the high gain of the device:

$$P_{det} = \frac{1}{2}\text{erfc}\left[\text{erfc}^{-1}(2P_{dark}) - \sqrt{SNR}\right]$$

where erfc( ) and efrc$^{-1}$( ) are the complementary error function and its inverse respectively. (See, M. A. Richards, "Fundamentals of Radar Signal Processing". New York: McGraw-Hill, 298-336 (2005).) The calculated dark current versus the dark count rate for different detection efficiency values is shown in FIG. 6(B).

Table 1 lists the device performance characteristics based on device parameters, ROIC noise and the calculations outlined above for devices having Structures A and B.

TABLE 1

| Device Type | Internal Dark Current (A) | Injector (μm) | DCR (Hz) | Gain | $t_{resp}$ (nsec) | QE (%) | Jitter (psec) |
|---|---|---|---|---|---|---|---|
| Structure A | ~10$^{-12}$@ 200° K | 1 | ~3 × 10$^3$@ 200K | ~1000 | ~1 | 95 | ~20 |
| | ~10$^{-13}$@ 150° K | | ~400@ 150K | | | | |
| Structure B | ~10$^{-13}$@ 250° K | 1 | ~0.1@ 250K | >10$^4$ | <1 | 95 | <20 |

For comparison, table 2 provides a concise comparison between some known, state-of-the-art single-photon detector technologies and an exemplary embodiment of a single-photon detector of the present disclosure (denoted "SPID").

TABLE 2

| Device | Detection Efficiency | Dark Count Rate (Hz) | Internal Gain | Speed | Temp. (K) | Wavelength (μm) |
|---|---|---|---|---|---|---|
| SPID | >95% | <100 | ~$10^4$ | ≥1 GHz | 150-250 | 1.6 |
| Superconducting Nanowire | 57% (in cavity) | 0.15 | N/A | <1 GHz | <2 | 1.3 |
| Superconducting Tunnel Junction | 45% @ 0.35 μm | N/A | N/A | 10 kHz | 0.4 | 0.5 |
| Superconducting Transition Edge | 95% | 3 | N/A | 100 kHz | 0.1 | 1.55 |
| Silicon APD | 74% @ 0.6 μm | 0.008 (linear); 25 (Geiger) | N/A in Geiger | 30 MHz | 78-290 | 1 |
| Infrared InGaAs APD | 33% @ 1.06 μm; 10% @ 1.55 μm | 91 | N/A in Geiger | 100 MHz | 200-300 | 1.3-1.6 |
| Infrared PMT | 2% | 200,000 | ~$10^6$ | 10 MHz | 200 | 1.55 |
| Frequency Upconversion | 59% | 460,000 | N/A | 10 MHz | 300 | 1.55 |
| Q-Dot SPDs | 12% @ 0.55 μm | 0.002 | N/A | 250 kHz | 4 | 0.5 |

Figure 7:
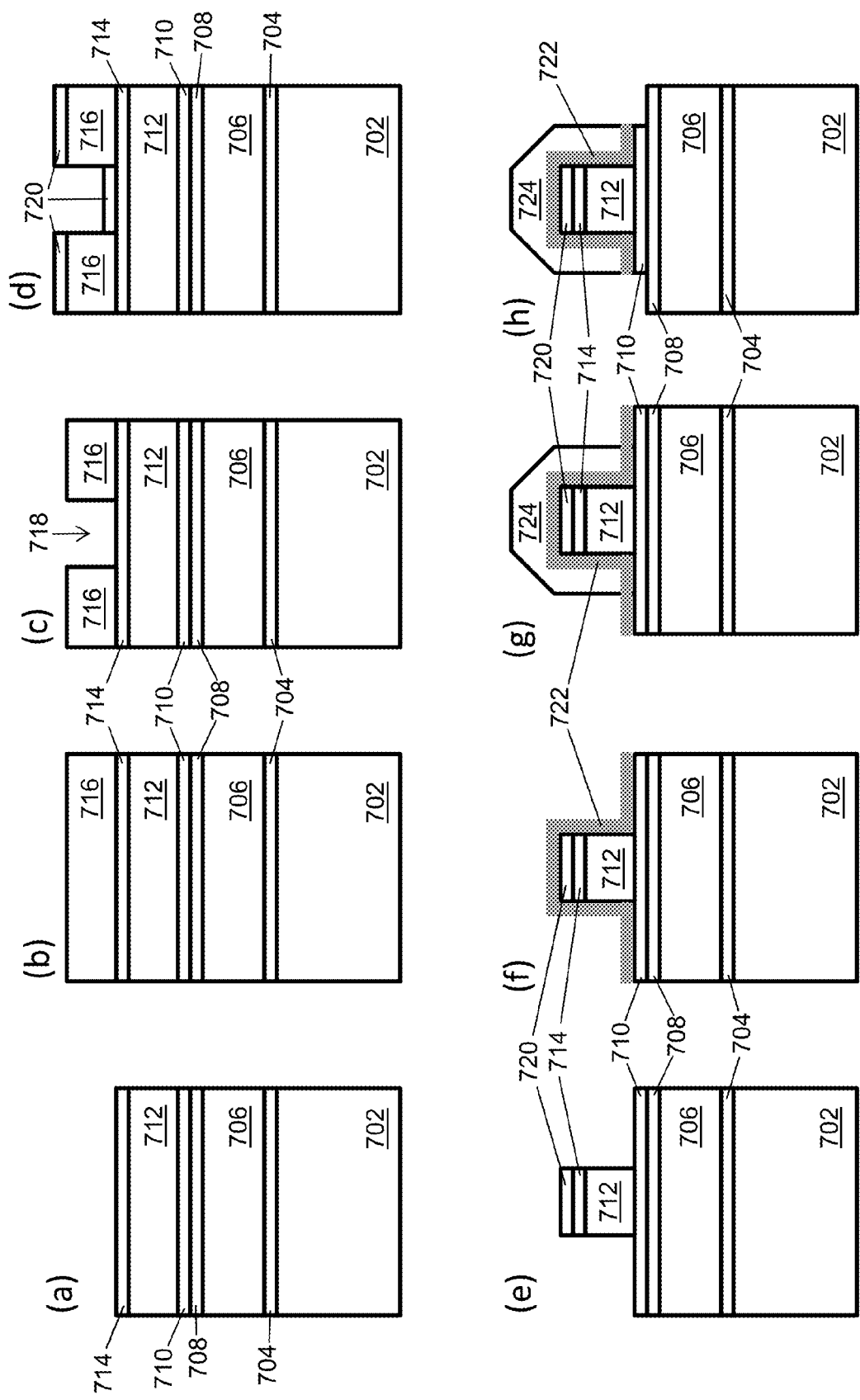
FIGS. 7 and 8. The process flow for a type-A single-photon nano-injection detector, starting from an epitaxially grown wafer, and ending with a processed device ready for hybridization. The process is the same for Type-B except in the 5th step, a short selective wet etch is added after the selective dry etch.
Figure 8:
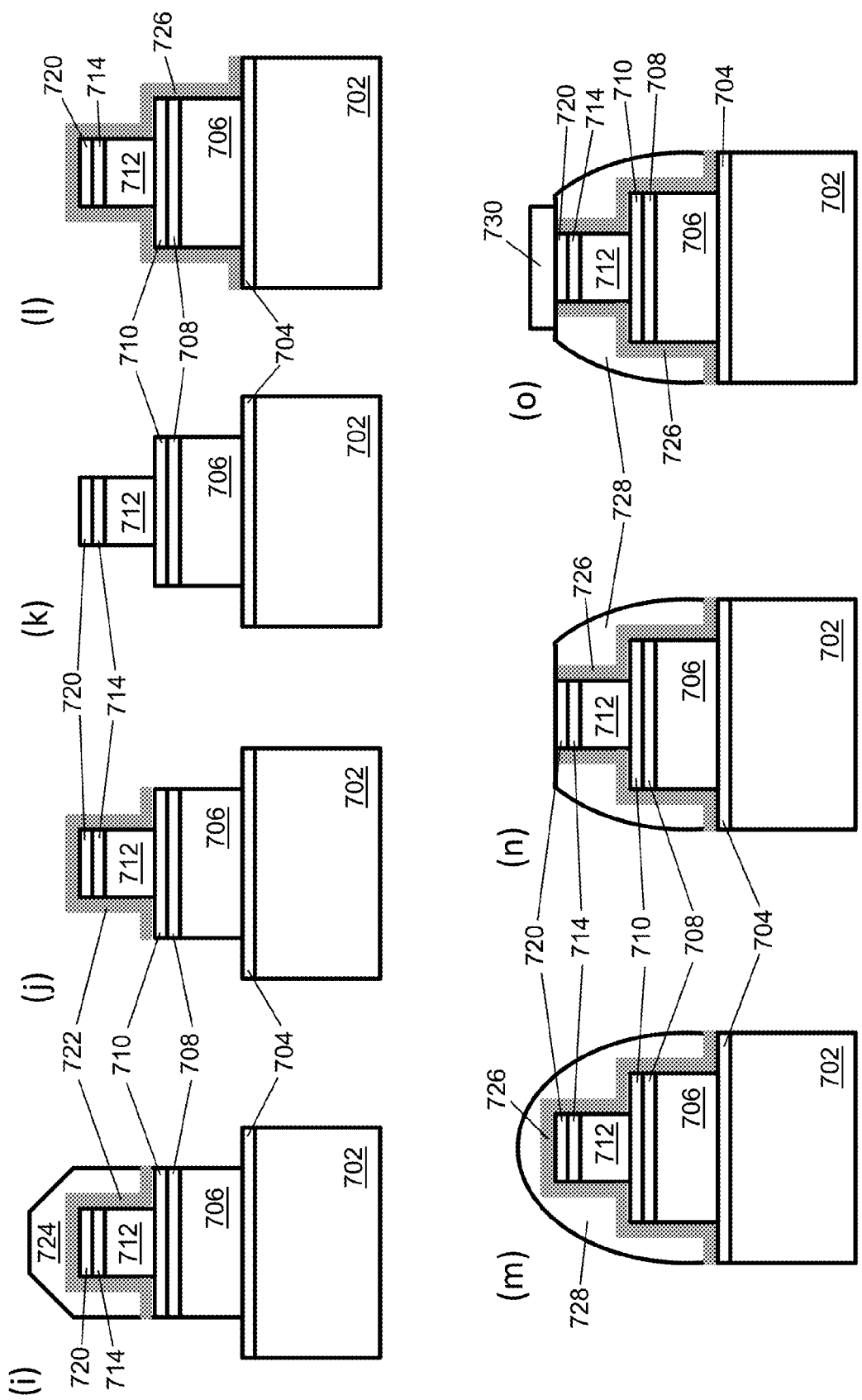

Single-Photon Detector Fabrication:

The photon detectors can be fabricated using known epitaxial growth, etching and lithographic techniques. FIGS. 7 and 8 are schematic diagrams showing an example of a fabrication scheme that can be used to make a photon detector having Structure A. An epitaxially grown semiconductor heterostructure from which the detectors can be fabricated is shown in panel (a). The structure comprises a substrate 702 (such as an InP substrate), an optional buffer layer 704 (such as a compositionally graded InGaAs layer) to facilitate the epitaxial growth of the overlying layer of photon absorbing material 706 (such as a layer of InGaAs), a layer of potential barrier forming material 708 (such as a layer of GaAsSb), a layer of passivating material 710 (such as a layer of InAlAs), a layer of carrier injecting material 712 (such as a layer of InP), and a layer of electrically conducting material 714 (such as InGaAs, to provide a contact. A resist material 716, such as PMMA/MMA, is deposited over the heterostructure (panel (b)) and patterned using, for example, e-beam lithography to define the opening 718 for a metal contact (panel (c)). A metal film 720 of, for example, Cr/Au/Ni is then deposited over the opening using, for example, e-beam evaporation (panel (d)). The PMMA/MMA resist and the metal film deposited thereon are then removed and the underlying heterostructure is selectively etched down to the InAlAs etch stop (panel (e)) to form the nanoinjector. Once the nanoinjector is formed, the sides are passivated with a layer of $SiO_2$ 722 via PECVD (panel (f)), and the isolation mesa is defined with photolithography using a photoresist 724 and dry/wet etching (panels (g)-(j)). Then the partly etched $SiO_2$ layer is removed (panel (k)) and a PECVD SiN layer 726 is deposited (panel (l)). The passivated device is then planarized using spin on glass 728 (panel (m)), which is then partly removed in an etchback process to expose the top metal of the nanoinjector (panel (n)). Finally, a larger contact 730 is evaporated on the top of the planarized nanoinjector (panel (o)) to facilitate the hybridization process.

The process shown in FIG. 7 can be modified for the fabrication of a photon detector having Structure B by adding a selective wet etch after the selective dry etch in step (e).

Hybridized arrays of the single-photon detectors can be formed. The processing of the nanoinjection detectors ends with the etchback of spin-on-glass (panel (n)). Once the nanoinjectors are accessible, a thin metal film of 30 nm Cr/40 nm Ni/50 nm Au can be lifted-off as under bump metallurgy (panel (o)). Additionally, a thin (e.g., 100 nm) Au layer can be deposited over the entire sample as an electroplating seed layer. Using photolithography, openings can be formed on the seed layer using a thick photoresist (e.g., AZ 9260). The indium bumps can be electroplated on these openings using an indium sulfamate bath. The Au seed layer can be etched using a cyanide based solution and the bumps can be reflowed using a custom made flux. The array can then be polished to optical grade smoothness using diamond pads and silica nanospheres. The hybridization of the nano-injection detector arrays can be performed using a flipchip bonder, SET FC150. This bonder can perform alignment and integration with high accuracy, and can apply forces ranging from 0.25 N to 2000 N. It has integrated carbide heaters on both sides that can increase the temperature from room temperature to 450° C. in less than a minute. It is equipped with two bonding arms: a high force bonding arm (Universal Bonding Arm) to provide accurate high pressure, high temperature thermocompression bonding, and a high accuracy bonding arm (Solder Reflow Arm) that provides relatively moderate pressure, high temperature and advanced z-control and thermo-compression modes. With the right calibration, the machine has 1 μm postbonding accuracy.

For the indium bump bonding process, one can choose amongst two methods: a) keeping the temperature slightly less than melting point of indium and applying a compression of approximately 1 g/pixel. This method can result in a finite resistance between the fused indium bumps due to the presence of a thin indium oxide layer in between. However, the resistive indium oxide layer can be broken after applying a voltage bias through the bumps; and b) heating to above the melting point of indium, and applying less than 10 mg/pixel to fuse molten indium bumps. This method ensures good electrical contact, but if the force is too excessive, the bumps can spread too much and short-circuit.

Figure 9:
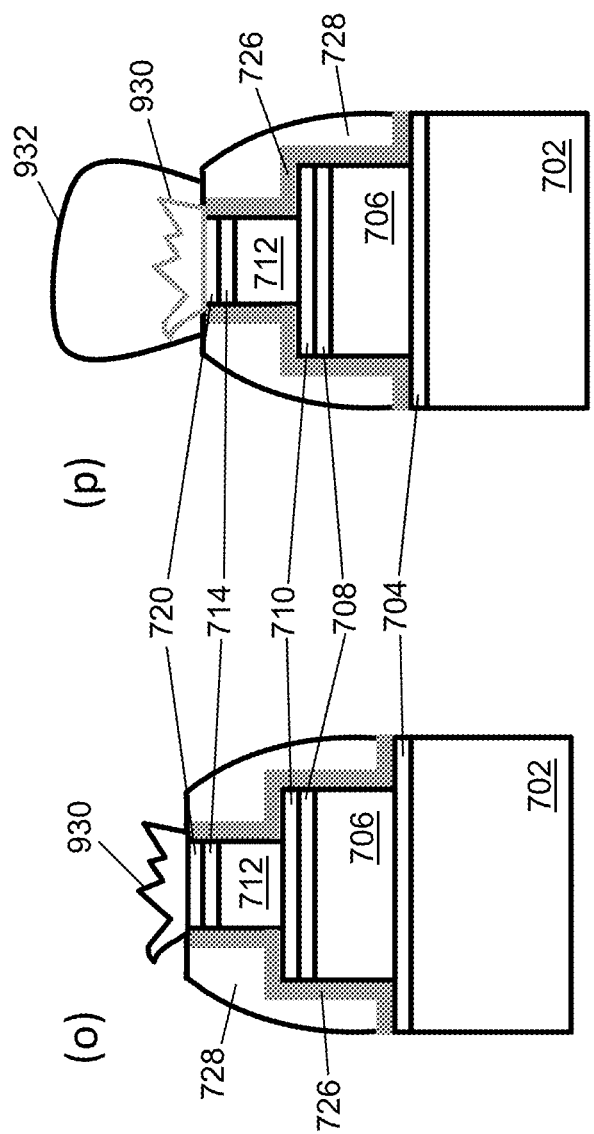
FIG. 9. An alternative process flow for the final contact formation steps of a type-A single-photon nano-injection detector.

The process shown in FIG. 9 describes an alternative fabrication process for manufacturing the final contact including the steps of (o) electroless plating 930 of the contact metal and (p) final contact electroplating 932.

Example

Building around the core nano-injection mechanism and the finite-element-method simulation, different nano-injection detector variants have been designed.

Device Processing

Quad-Layer Liftoff Patterns to Prevent Organic Contamination

An important parameter that must be considered in design of a high speed device is the contact resistance, especially for nanometer-scale devices. Patterned photo and electron beam resists commonly leave small traces of organics on the surface. This residue is not a problem in large-area contacts. However, for the small contacts used here the resistivity can become a significant issue since it leads to long RC lifetime, slowing down the devices.

To prevent this a quad layer lift-off pattern was developed with 250 nm $SiO_2$/100 nm SiN/5 nm $SiO_2$/PMMA or 250 nm $SiO_2$/100 nm SiN/5 nm $SiO_2$/photoresist. This stack, after patterning was developed by the resist developer, and then dry etched in $CF_4$ plasma. Finally, the undercut was formed with a buffered oxide etch. This process prevents any organic residue from getting in touch with the semiconductor surface, while forming a reliable negative profile for thick metal evaporation.

Lowering the Contact Resistance Through Removal of Surface Oxides and Metal Stack Optimization Even without organic contamination, high-speed contacts benefit from surface pre-treatment and a correct stack of metals to interface with that particular semiconductor. Since the preamplifier has a nominal input impedance of 50 ohm, any comparable contact resistance will drop the voltage seen on the preamplifier. A contact resistance of 100 Ohms, which is negligible compared to the device impedance, can drop the voltage to a third of what it should be. In parallel, it would increase the RC constant in the pre-amplification loop, slowing the device response.

Two approaches to this problem were applied: The first approach was using a short surface treatment with ammonium hydroxide, followed by Ti/Au/Ni evaporation. Ammonium hydroxide was responsible for removing the surface oxides and any possible organics on the surface, however, it also attacked the resists and so the treatment time was kept short at 10~15 secs. The resulting contact resistance was 6 Ohms over a 10 μm by 40 μm rectangle, or equivalently 2e-5 Ohm·$cm^2$.

The second approach was sputtering a base metal before patterning, followed by patterning and lift-off, and finally selectively removing the base metal. As the base metal, molybdenum and titanium/tungsten (10%/90%) were chosen. The advantage of this approach was that it allowed a more extensive oxide/organics cleaning of the semiconductor using $NH_4OH$, thereby lowering the contact resistance into 1e-7 Ohm·$cm^2$ and below. Both of these metals have been shown to be etched in $SF_6$ based plasmas.

Complete Isolation

The complete isolation of mesas is an important step as incomplete isolation leads to big mesas, and results in larger capacitance, longer response time, larger dark current and lower sensitivity. It was recently identified that with selective etches which remove the InGaAs absorbing layer, the InGaAs/InP graded junction was not removed. This 50 nm thick layer is highly conductive and leaks the carriers from neighboring elements as the diffusion length is greater than 100 μm. To overcome this problem a non-selective dry etch based on $CH_4/H_2/Ar$ plasma is utilized.

Planarization

The planarization material used to fill in trenches of (~1.5 μm deep) of the devices may be spin-on glass (SOG) due to its good thermal and mechanical stability. The process has been designed with SOG to have self-aligned contact openings, which makes it possible to planarize submicron devices and then expose their contacts selectively. The SOG etch back is however a risky process as it may not always expose contacts, even under careful monitoring—including focused ion beam cross sections or atomic force microscope scans. Additionally, the etchback process for SOG can oxidize the top metal (nickel) or sputter organics onto the contacts, thereby increasing resistance.

To improve resistance and check the complete removal of the SOG, electroless gold plating may be used, which is a process that converts the top nickel oxide to gold and deposits dense gold contacts which are easy to observe. These gold contacts can then be used for robust direct probing or electroplating of a thick layer of gold.

Device Measurements

Two measurement setups (cryogenic temperature and room temperature) were used. Common equipment used in the two set ups consist of a nanosecond pulsed butterfly laser, a real time oscilloscope to measure and quantify device response, bias-T to separate the DC power to the detector from high frequency response to the low noise amplifier, charge sensitive amplifier (preamplifier), voltage amplifier, multimeter, low frequency LNA. Labview programs were developed for IV measurement as well as spatial sensitivity maps of devices.

Low Temperature Measurement

The cryostation was modified with a backside illumination set up consisting of a GRIN lens on a custom made holder to illuminate device (as top side illumination lacks calibration). A high-speed probe was used to allow for high-speed electrical measurement at various temperatures. The device sits on a flatbed on a U stage with a window in the middle to allow for backside illumination. The liquid nitrogen tank, connected to cryostat by a tube required effective isolation, which was made possible using different types of vibration absorbing material to damp both high frequency and low frequency vibrations.

Room Temperature Top Illumination Set Up

During the intermediate steps of processing of new generation of devices a set up for top down illumination of samples was developed with a 2 μm spot size. This allows intermediate measurement after each processing step before polishing the back of sample. For accurate laser power calibration, response of a commercial PIN detector which replaced the sample was measured to accurately quantify the laser power reaching the sample.

Measurement Results from Type A Device

Figure 10:
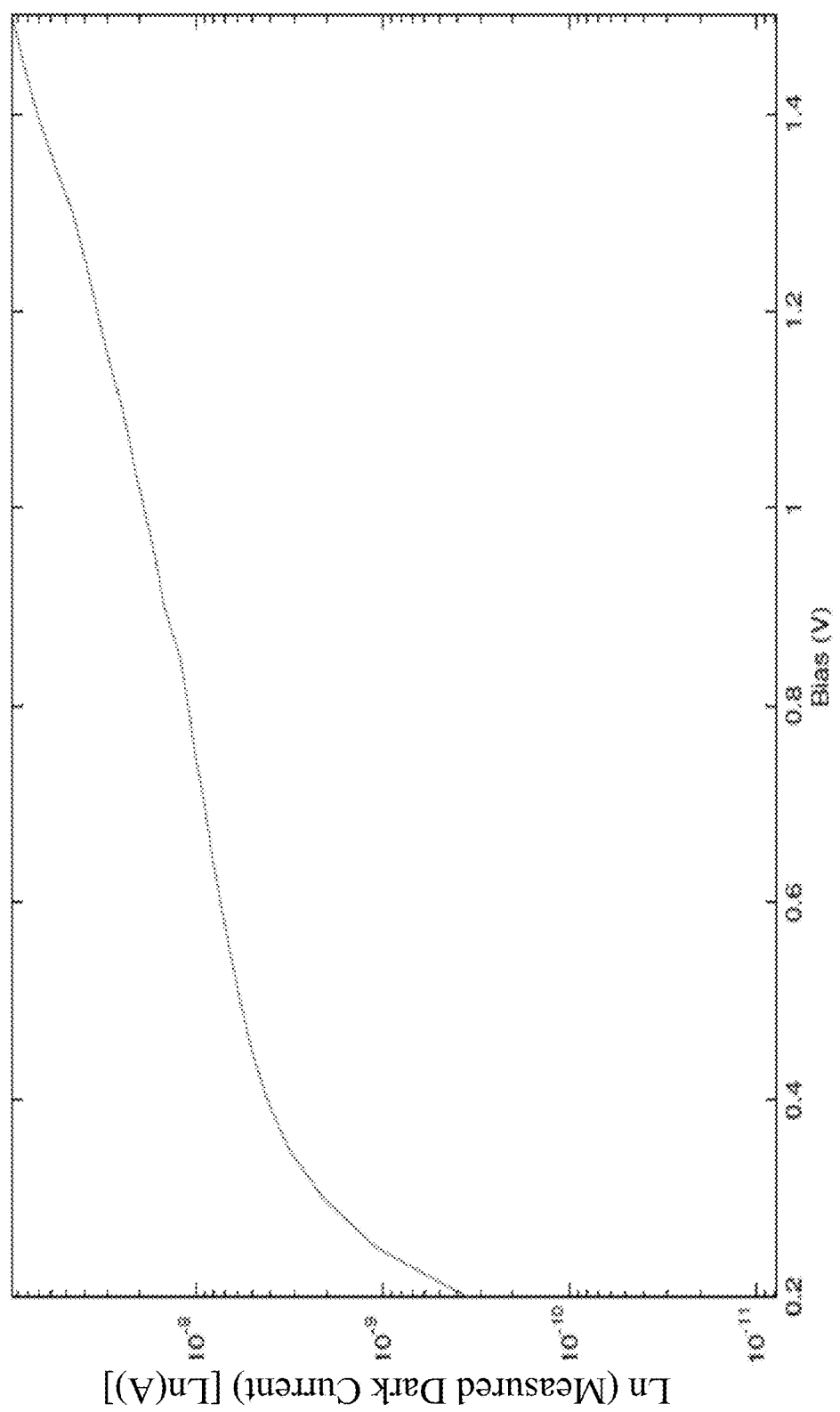
FIG. 10. The dark current versus voltage of an unpassivated device at room temperature.

Isolated devices with 5 μm injectors were tested before passivation. It showed a dark current of 9.72E-08 A at −1.5V and a gain of 9 at room temperature. Gain was measured from the pulsed response. Dark Current vs. bias is plotted in FIG. 10. Rise time was 4 ns and fall time was 29 ns. For a power of 7E-7 W reaching the sample, responsivity was measured to be 580 A/W.

Figure 11:
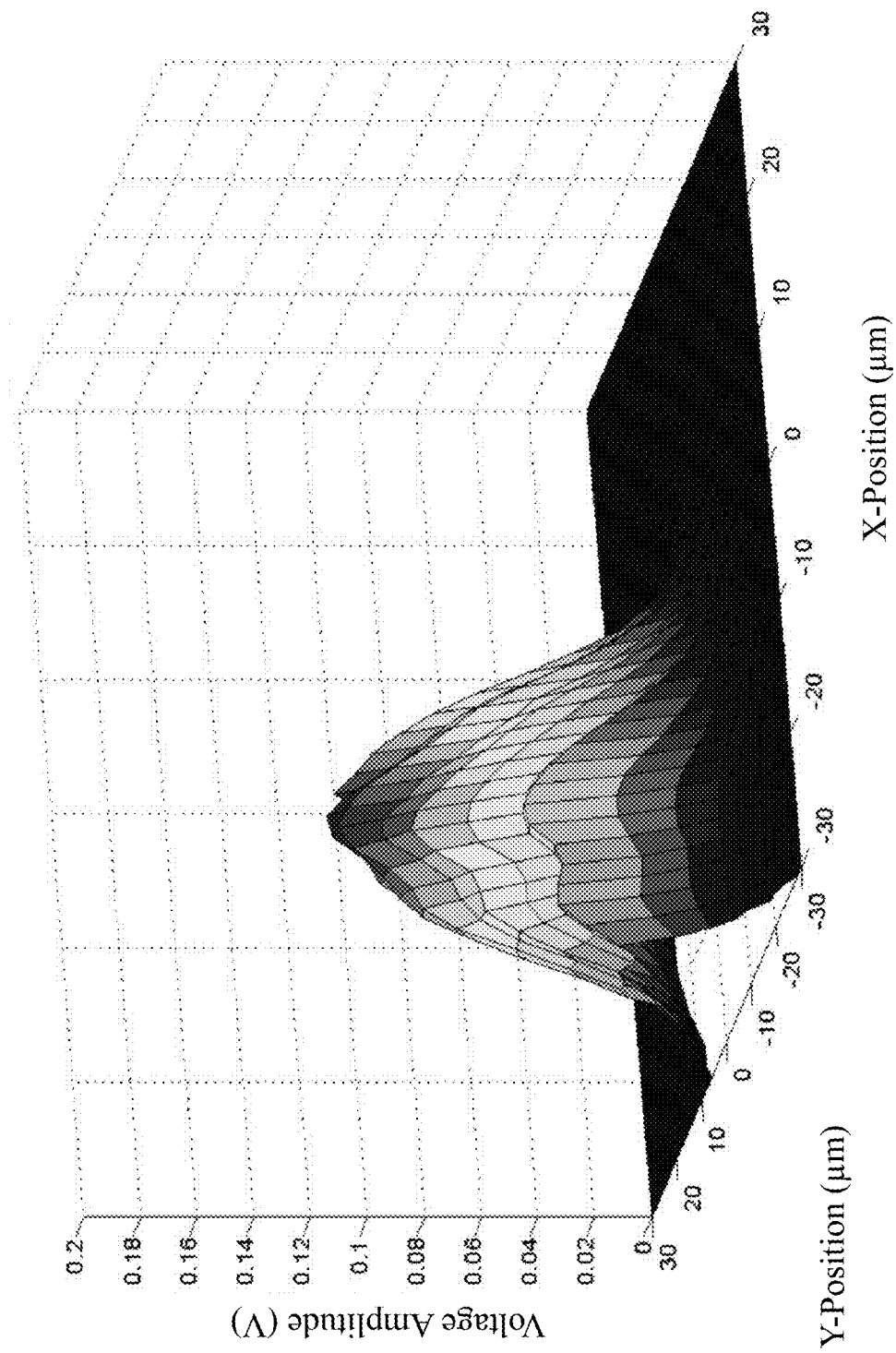
FIG. 11. Spatial photo-response of the device.

The spatial response of the device was evaluated by scanning a ~2 μm laser spot over the device. The following figure shows the spatial response, which is an almost Gaussian with ~20 μm FWHM. FIG. 11.

Figure 12:
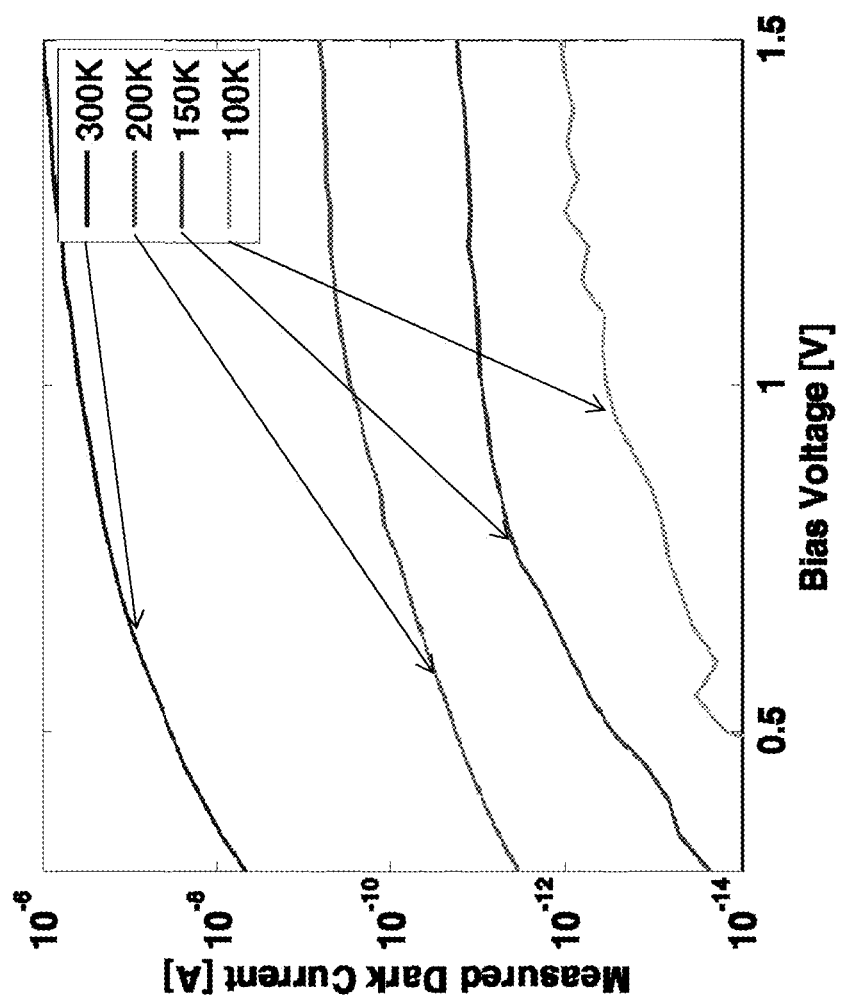
FIG. 12. Dark current versus bias voltage of a passivated device at 300K, 200K, 150K and 100K.

Five μm isolated nano-injection devices after passivation were tested. They showed a dark current of 1 μA at 1.5 V and at room temperature. As the devices were cooled, the dark current decreased rapidly, becoming 600 pA at 200 K, 18 pA at 150 K and about 1 pA at 100K, all at 1.5 V bias. FIG. 12.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A photon detector comprising a semiconductor heterostructure, the semiconductor heterostructure comprising:
   (a) a photon absorber comprising a layer of photon absorbing material which absorbs photons to generate electron-hole pairs; and
   (b) a carrier injector adapted to inject carriers of a first type into the photon absorber, the carrier injector comprising:
      (i) a layer of carrier injecting material capable of generating the carriers of the first type upon the application of a bias voltage; and
      (ii) a carrier trap disposed between the layer of carrier injecting material and the layer of photon absorbing material, the carrier trap comprising a layer of potential barrier-forming material which forms a potential trap for carriers of a second type;
   wherein the photon absorbing material, the carrier injecting material and the potential barrier-forming material have a band structure with a type II band alignment;
   further wherein the photon detector is characterized by at least one of: the ability to detect a single-photon with a quantum efficiency of at least 50%; a bandwidth of at least 1 GHz; or a dark count rate of no greater than 1 kHz at a temperature in the range from about 150K to 298K; and further wherein the layer of carrier injecting material comprises a first region having a first dopant concentration and a second region disposed between the first region and the carrier trap, wherein the second region has a dopant concentration that is lower than the first dopant concentration.

2. The photon detector of claim 1 characterized by the ability to detect a single-photon with a quantum efficiency of at least 50% at 1.55 μm; a bandwidth of at least 1 GHz; a gain of 300 or better at a bias voltage of 1 V at 1.55 μm, and a dark count rate of no greater than 1000 Hz at a temperature in the range from about 150K to 298K and a bias voltage of 1 V.

3. The photon detector of claim 2, wherein the second region is undoped.

4. A photon detector comprising a semiconductor heterostructure, the semiconductor heterostructure comprising:
   (a) a photon absorber comprising a layer of photon absorbing material which absorbs photons to generate electron-hole pairs; and
   (b) a carrier injector adapted to inject carriers of a first type into the photon absorber, the carrier injector comprising:
      (i) a layer of carrier injecting material capable of generating the carriers of the first type upon the application of a bias voltage; and
      (ii) a carrier trap disposed between the layer of carrier injecting material and the layer of photon absorbing material, the carrier trap comprising a layer of potential barrier-forming material which forms a potential trap for carriers of a second type;
   wherein the photon absorbing material, the carrier injecting material and the potential barrier-forming material have a band structure with a type II band alignment;
   further wherein the photon detector is characterized by at least one of: the ability to detect a single-photon with a quantum efficiency of at least 50%; a bandwidth of at least 1 GHz; or a dark count rate of no greater than 1 kHz at a temperature in the range from about 150K to 298K;
   the photon detector further comprising a layer of passivating material disposed between the layer of carrier injecting material and the layer of potential barrier-forming material; and
   further wherein the photon absorbing material is InGaAs, the carrier injecting material is n-type doped InP, the passivating material is InAlAs and the potential barrier-forming material is p-type doped GaAsSb.

5. The photon detector of claim 4, wherein the layer of GaAsSb has a thickness of no greater than about 60 nm and the layer of InAlAs has a thickness of no greater than about 60 nm.

6. The photon detector of claim 5, wherein the layer of InAlAs has a thickness of no greater than about 15 nm.

7. The photon detector of claim 6, wherein the layer of GaAsSb has a thickness of no greater than about 50 nm and the layer of InAlAs has a thickness of no greater than about 10 nm.

8. The photon detector of claim 6, wherein the GaAsSb has a dopant concentration of no greater than $5 \times 10^{17}$.

9. The photon detector of claim 6, wherein the layer of carrier injecting material comprises a first region comprising InP having a first n-type dopant concentration and a second region disposed between the first region and the carrier trap, wherein the second region comprises InP having an n-type dopant concentration that is lower than the first n-type dopant concentration.

10. A photon detector comprising a semiconductor heterostructure, the semiconductor heterostructure comprising:
   (a) a photon absorber comprising a layer of photon absorbing material which absorbs photons to generate electron-hole pairs; and
   (b) a carrier injector adapted to inject carriers of a first type into the photon absorber, the carrier injector comprising:
      (i) a layer of carrier injecting material capable of generating the carriers of the first type upon the application of a bias voltage; and
      (ii) a carrier trap disposed between the layer of carrier injecting material and the layer of photon absorbing material, the carrier trap comprising a layer of potential barrier-forming material which forms a potential trap for carriers of a second type;
   wherein the photon absorbing material, the carrier injecting material and the potential barrier-forming material have a band structure with a type II band alignment;
   and further wherein the photon detector is characterized by at least one of: the ability to detect a single-photon with a quantum efficiency of at least 50%; a bandwidth of at least 1 GHz; or a dark count rate of no greater than 1 kHz at a temperature in the range from about 150K to 298K;
   and further wherein the diameter of the layer of carrier injecting material is smaller than the diameter or the length of the layer of photon absorbing material.

11. The photon detector of claim 10, further comprising a layer of passivating material disposed between the layer of carrier injecting material and the layer of potential barrier-forming material.

12. The photon detector of claim 11, wherein the layer of passivating material does not produce an additional potential barrier in the conduction band of the band structure.

13. The photon detector of claim 12, characterized by the ability to detect a single-photon with a quantum efficiency of at least 80% at 1.55 μm.

14. The photon detector of claim 10, wherein the photon detector is characterized by the ability to detect a single-photon with a quantum efficiency of at least 50% 1.55 μm, a bandwidth of at least 1 GHz, and a dark count rate of no greater than 1 kHz at a temperature in the range from about 150K to 298K and a bias voltage of 1 V.

15. The photon detector of claim 10, wherein the diameter of the layer of carrier injecting material is no greater than about 5 μm.

16. The photon detector of claim 10, wherein the diameter of the layer of carrier injecting material is no greater than about 1 μm.

17. The photon detector of claim 10, wherein at least one layer of the semiconductor heterostructure comprises a n-type dopant and at least one other layer of the semiconductor heterostructure comprises a p-type dopant.

18. A photon detector comprising a semiconductor heterostructure, the semiconductor heterostructure comprising:
  (a) a photon absorber comprising a layer of photon absorbing material which absorbs photons to generate electron-hole pairs; and
  (b) a carrier injector adapted to inject carriers of a first type into the photon absorber, the carrier injector comprising:
    (i) a layer of carrier injecting material capable of generating the carriers of the first type upon the application of a bias voltage; and
    (ii) a carrier trap disposed between the layer of carrier injecting material and the layer of photon absorbing material, the carrier trap comprising a layer of potential barrier-forming material which forms a potential trap for carriers of a second type;
  wherein the photon absorbing material, the carrier injecting material and the potential barrier-forming material have a band structure with a type II band alignment;
  and further wherein the photon detector is characterized by at least one of: the ability to detect a single-photon with a quantum efficiency of at least 50%; a bandwidth of at least 1 GHz; or a dark count rate of no greater than 1 kHz at a temperature in the range from about 150K to 298K;
  and further wherein the thickness of the layer of photon absorbing material is in the range from about 1000 nm to about 5000 nm.

19. A photon detector comprising a semiconductor heterostructure, the semiconductor heterostructure comprising:
  (a) a photon absorber comprising a layer of photon absorbing material which absorbs photons to generate electron-hole pairs; and
  (b) a carrier injector adapted to inject carriers of a first type into the photon absorber, the carrier injector comprising:
    (i) a layer of carrier injecting material capable of generating the carriers of the first type upon the application of a bias voltage; and
    (ii) a carrier trap disposed between the layer of carrier injecting material and the layer of photon absorbing material, the carrier trap comprising a layer of potential barrier-forming material which forms a potential trap for carriers of a second type;
  wherein the photon absorbing material, the carrier injecting material and the potential barrier-forming material have a band structure with a type II band alignment;
  and further wherein the layer of carrier injecting material comprises a first region having a first dopant concentration and a second region disposed between the first region and the carrier trap, wherein the second region has a dopant concentration that is lower than the first dopant concentration.

20. A photon detector comprising a semiconductor heterostructure, the semiconductor heterostructure comprising:
  (a) a photon absorber comprising a layer of photon absorbing material which absorbs photons to generate electron-hole pairs; and
  (b) a carrier injector adapted to inject carriers of a first type into the photon absorber, the carrier injector comprising:
    (i) a layer of carrier injecting material capable of generating the carriers of the first type upon the application of a bias voltage; and
    (ii) a carrier trap disposed between the layer of carrier injecting material and the layer of photon absorbing material, the carrier trap comprising a layer of potential barrier-forming material which forms a potential trap for carriers of a second type;
  wherein the photon absorbing material, the carrier injecting material and the potential barrier-forming material have a band structure with a type II band alignment;
  the photon detector further comprising a layer of passivating material disposed between the layer of carrier injecting material and the layer of potential barrier-forming material, and further wherein the photon absorbing material is InGaAs, the carrier injecting material is n-type doped InP, the passivating material is InAlAs and the potential barrier-forming material is p-type doped GaAsSb.

* * * * *